United States Patent
Berglund et al.

(10) Patent No.: US 9,773,358 B2
(45) Date of Patent: Sep. 26, 2017

(54) DEVICE AND METHOD FOR DETECTING FAULTS IN ELECTRONIC SYSTEMS

(71) Applicant: CABECO AB, Trollhättan (SE)

(72) Inventors: Sam Berglund, Trollhättan (SE); Sverker Glemring, Trollhättan (SE); Johan Rosendahl, Trollhättan (SE)

(73) Assignee: CABECO AB, Trollhattan (SE)

( * ) Notice: Subject to any disclaimer, the term of this patent is extended or adjusted under 35 U.S.C. 154(b) by 0 days.

(21) Appl. No.: 14/894,754

(22) PCT Filed: Jun. 2, 2014

(86) PCT No.: PCT/EP2014/061397
§ 371 (c)(1),
(2) Date: Nov. 30, 2015

(87) PCT Pub. No.: WO2014/191579
PCT Pub. Date: Dec. 4, 2014

(65) Prior Publication Data
US 2016/0110937 A1    Apr. 21, 2016

(30) Foreign Application Priority Data

May 31, 2013  (SE) ...................................... 1300399
Oct. 1, 2013   (EP) ...................................... 13186835

(51) Int. Cl.
*G01M 17/00* (2006.01)
*G06F 7/00* (2006.01)
(Continued)

(52) U.S. Cl.
CPC ......... *G07C 5/0808* (2013.01); *G01R 31/007* (2013.01); *G07C 5/0883* (2013.01); *G07C 2205/02* (2013.01)

(58) Field of Classification Search
CPC ............................ G01R 31/007; G07C 5/0883
(Continued)

(56) References Cited

U.S. PATENT DOCUMENTS 5,884,202 A * 3/1999 Arjomand ............. G01M 15/05
                                                      340/12.54
6,094,609 A    7/2000 Arjomand
(Continued)

FOREIGN PATENT DOCUMENTS

EP    0 754 940 A2    1/1997
EP    1 845 494 A2    10/2007
(Continued)

OTHER PUBLICATIONS

International Search Report (PCT/ISA/210) issued on Oct. 23, 2014, by the Japanese Patent Office as the International Searching Authority for International Application No. PCT/EP2014/061397.
(Continued)

*Primary Examiner* — Maceeh Anwari
(74) *Attorney, Agent, or Firm* — Buchanan Ingersoll & Rooney P.C.

(57) ABSTRACT

A device and a method for detecting faults in an electrical system. The fault detection device includes, a first measuring unit configured to receive a first error value indicative of a fault in a subset of a plurality of components, a communication unit configured to provide information to a user interface, a second measuring unit configured to be electrically connected directly to each of at least two of the plurality of components, and a processing unit connected to and configured to control the first measuring unit, the second measuring unit, and the communication unit. The second measuring unit is configured to, based on the first error value, determine a operational status of each of the components in the subset.

16 Claims, 3 Drawing Sheets

(51) Int. Cl.
*G06F 11/30* (2006.01)
*G06F 19/00* (2011.01)
*G07C 5/00* (2006.01)
*G07C 5/08* (2006.01)
*G01R 31/00* (2006.01)

(58) Field of Classification Search
USPC ........................................................ 701/29.1
See application file for complete search history.

(56) References Cited

U.S. PATENT DOCUMENTS

| | | |
|---|---|---|
| 2003/0020759 A1 | 1/2003 | Cancilla et al. |
| 2005/0193252 A1 | 9/2005 | Cancilla et al. |
| 2007/0244611 A1 | 10/2007 | Brozovich |
| 2009/0043444 A1 | 2/2009 | Gettner et al. |
| 2010/0262335 A1 | 10/2010 | Brozovich |
| 2012/0046897 A1 | 2/2012 | Panko |

FOREIGN PATENT DOCUMENTS

| | | |
|---|---|---|
| WO | WO 02/090918 A2 | 11/2002 |
| WO | WO 2012/024147 A1 | 2/2012 |

OTHER PUBLICATIONS

Written Opinion (PCT/ISA/237) issued on Oct. 23, 2014, by the Japanese Patent Office as the International Searching Authority for International Application No. PCT/EP2014/061397.

\* cited by examiner

DEVICE AND METHOD FOR DETECTING FAULTS IN ELECTRONIC SYSTEMS

FIELD OF THE INVENTION

The present invention relates to a device and a method for detecting a fault in an electrical system.

BACKGROUND

Electronics and electronic units, commonly installed in e.g. vehicles, are becoming increasingly advanced. As a consequence, troubleshooting such electronic units becomes more difficult and requires an increasing amount of effort and competence. For example, in today's vehicles over 80% of faults are related to electronics in the vehicle. A common way to address electronic faults in vehicles is to replace components until the vehicle is again functional. This often leads to that working components are unnecessarily replaced, thus such a method becomes relatively expensive.

Many vehicles have an electronic control unit (ECU) which controls several functions in the vehicle such as e.g. behaviors of the chassis, anti-slip functions, ABS, climate control, airbags or SRS. Thus, a vehicle may have hundreds of ECUs controlling many functions.

In electronic units, such as e.g. an ECU of a vehicle, faults may occur. Such faults may be due to communication errors, or faults derived from the environment such as temperature, humidity, and vibrations. Vehicle manufacturers typically program the ECU to detect and react to such errors or faults in the system.

Thus, when constructing and programming an ECU one attempts to configure the ECU to detect and determine all possible errors. However, if an error appears that is not identified before the programming of the ECU, the ECU is not able to determine and recognize the error, thus a common message transmitted to a user/mechanics is "Fault or DTC not found" (DTC: Diagnostic Trouble Code).

A diagnostic method which comprises self diagnosing is called "on-board diagnostics" (OBD). In order to interpret OBD-faults a user has to connect to the vehicle with an OBD-instrument able to read the error codes from an ECU of the vehicle. In the vehicle industry, there are standard protocols for reading errors from the ECU. Furthermore, there are databases comprising error codes with instructions for what type of error the error code corresponds to.

A problem occurs when errors that are not previously identified or described appear. A common procedure is to connect a multimeter and oscilloscope in order to resolve the problem. This procedure is in many situations not satisfactory.

SUMMARY OF THE INVENTION

In view of the above, it is a general object of the present invention to provide a device and a method for facilitated detection of faulty electrical components in an electrical system.

According to a first aspect of the invention it is therefore provided a fault detection device for detecting faults in an electrical system comprising at least one electrical control unit electrically connected to a plurality of electrical components, the fault detection device comprising: a first measuring unit configured to receive, from the electrical control unit, a first error value indicative of a fault in a subset comprising at least two of the plurality of electrical components; a communication unit configured to provide information to a user interface; a second measuring unit configured to be electrically connected directly to each of the at least two of the plurality of electrical components in the subset; and a processing unit connected to and configured to control the first measuring unit, the second measuring unit, and the communication unit, wherein the second measuring unit is configured to, based on the first error value indicative of a fault in the subset, determine an operational status of each of the components in the subset; and wherein, the communication unit is configured to provide, to the user interface, an indication of the operational status.

According to example embodiments, the subset of electrical components in the plurality of electrical components may be two or several electrical components. In one example embodiment, all of the electrical components are comprised in the subset of electrical components.

In electrical systems of e.g. a vehicle there are often several hundreds of contacts. The present invention is based on the realization that there is a need for a more flexible fault detection method and device. The invention is further based on the realization that there is a need for reliving maintenance personnel working with the advanced technology of e.g. vehicles. The inventors have thus identified a lack of "know-how". The present invention is further based on the realization that a detection device may be connected to electrical components via an electrical control unit and/or directly to the subset of components where an error appeared.

An electrical component may for example be a sensor or an additional control unit or any other electrical component in an electrical system. A fault may be caused by e.g. a faulty or malfunctioning sensor. The first error value may indicate a fault that may have occurred in an electrical component connected to an electrical control unit. A fault may be derived from the environment such as temperature, humidity, and vibrations. A fault may further be that an error code was received that indicated a fault, thus, the electrical components may be functioning correctly, but the electrical control unit may be faulty. The second measuring unit may be connected at pins located on an electrical control unit such that the second measuring unit may be electrically connected directly to the electrical components connected to the electrical control unit. A status of an electrical component may be the voltage output from the component, or a fraction of a desired voltage output, or a value indicating whether the component functions properly.

An advantage of the present invention is to localize a fault which enables repairing and/or replacing the faulty component in the electrical system directly without risking replacing components that are functioning. For example, it is desirable to avoid replacing an expensive electrical control unit connected to for example sensors of an electrical system. In conventional systems, a maintenance personnel may replace several components and/or other units of the electrical system before the system works properly again. Thus, localizing the fault is advantageous from for example a cost and/or time saving point of view.

The control unit may include a microprocessor, microcontroller, programmable digital signal processor or another programmable device. The control unit may also, or instead, include an application specific integrated circuit, a programmable gate array or programmable array logic, a programmable logic device, or a digital signal processor. Where the control unit includes a programmable device such as the microprocessor, microcontroller or programmable digital signal processor mentioned above, the processor may further include computer executable code that controls operation of the programmable device.

According to one embodiment of the invention, the operational status may be determined for each of the electrical components in the subset of electrical components, wherein the operational status is an indication of whether each of the electrical components in the subset is faulty. An operational status gives an indication of whether the electrical component is working correctly or not. Such a status may for example be based on a correspondence between a measured voltage value across an electrical component and a desired voltage value.

According to one embodiment of the invention, the first error value may be received via a third measuring unit arranged between the first measuring unit and the electrical control unit. The third measuring unit may be an on-board diagnosing (OBD) unit of a vehicle.

According to one embodiment of the invention, the fault detection device may be electrically connected to the electrical system via a cable comprising an identification unit, wherein the processing unit and/or an external reader may be configured to receive, from the identification unit, information indicative of an identity of the cable and/or the corresponding electrical control unit. With the cable, which may be referred to as a smart cable, the processing unit and/or the external reader is configured to communicate with the cable, information can be retrieved indicative of a system identity, article number, statistics, number of measurements, etc. The processing unit may also program and save data to the identification unit in the cable. Thus, the identification unit may comprise a storage device. Using such cable may protect the electrical system against human error, for example connecting the wrong cable to the electrical control unit. The identification unit may further protect against clones and/or unauthorized manufactured cables. An external reader may be a portable device such as e.g. a mobile device.

According to one embodiment of the invention, the user interface may be a visual interface, audio interface, haptic interface, or combinations thereof. A visual and/or an audible user interface enables facilitated communication and usage of the device. An audible interface is advantageous for example when a user is not able to see the fault detection device during maintenance work. A visual interface is advantageous for example when providing instructions on localizing a particular part in the electrical system. A haptic user interface is based on motion, such as a vibration for providing an instruction to a user. The vibration may for example indicate that a certain process (e.g. download, upload, detecting fault) is finished, or that a process is started.

According to one embodiment of the invention, the fault detection device may further comprise a memory storage device configured to store fault information indicative of the first error value and/or the operational status of the electrical components. In order to enable further processing of fault information it may be needed to store the fault information concerning e.g. location of fault, time of fault, condition of the device/vehicle when the fault occurred etc. Storing of fault information on a memory storage device further enables storing of fault information in "off-line" mode for future processing.

According to one embodiment of the invention, the fault detection device may further comprise a transceiver configured to transmit fault information indicative of the first error value and/or the operational status to a remote unit, and to receive, from the remote unit, information relating to said fault information. The information may be e.g. instructions how to replace an electrical control unit and/or an electrical component, how and/or where to find a detected fault in the electrical system, how to correct/solve the fault. In other words, as a response to the transmitted fault information instructions related to the fault information is returned from the remote unit.

In one embodiment the transceiver is a wireless transceiver. Using wireless communication reduces the need for cables that may be an obstacle for a user of the fault detection device. It may also facilitate communication between the fault detection device and a remote unit. Wireless communication may be based on WiFi, Bluetooth, IR, or any other suitable technology.

In one embodiment of the invention, the second measuring unit is configured to be electrically connected simultaneously to each of said at least two of said plurality of electrical components in said subset during a measurement.

According to an embodiment of the invention, the second measuring unit is configured to determine an operational status simultaneously of each of said at least two electrical components.

According to an embodiment of the invention, the first and the second measuring unit is configured to be electrically connected to the same control unit, such as e.g. an electrical control unit of a vehicle. According to an embodiment of the invention, the first and the second measuring unit is configured to be simultaneously electrically connected to the same control unit, during a measurement.

According to a second aspect of the invention there is provided a system comprising the fault detection device according to the first aspect, a remote unit, and an electrical system comprising at least one electrical control unit electrically connected to a plurality of electrical components.

A remote unit may be a remote computer acting as "artificial intelligence". The remote unit may further be a computer able to store information indicative of the fault in a database. The remote computer may have instructions stored regarding instructions indicative of the fault. For example, instruction stored from a previous fault on a different but similar system.

According to one embodiment of the invention, the remote unit may be a central expert unit further configured to remotely control the electrical system. In some situations it may be advantageous to remotely control the electrical system. For example, if instructions are complicated or the fault requires additional expertise from e.g. a remote expert. A remote expert may further be a person located at a remote location. The remote expert may thus provide instructions to a user of the fault detection device on how to proceed with resolving a fault According to one embodiment of the invention, the electrical system may be comprised in a vehicle, an airplane, a medical device, a motorized device, or an electrical device. Furthermore, the invention may be applied to any electrical system, such as electrical systems in medical devices, motorized devices, airplanes, ventilation systems, nuclear power plants, other energy harvesting systems, boats, trains, etc.

Effects and features of this second aspect of the present invention are largely analogous to those described above in connection with the first aspect of the invention and embodiments mentioned are largely compatible with embodiments mentioned in connection with the first aspect of the invention.

According to a third aspect of the invention there is provided a method for detecting and diagnosing faults in an electrical system using the fault detection device according to the first aspect of the invention, the electrical system comprising at least one electrical control unit electrically connected to a plurality of electrical components, the method comprising the steps of: receiving, by the first measuring unit, from the electrical control unit, a first error value indicative of a fault in a subset comprising at least two of the plurality of electrical components; determining, by the second measuring unit, based on the first error value, an operational status of each of the electrical components in the subset of electrical components; and providing, to an user interface, an indication of the operational status.

In one embodiment of the invention, determining the operational status of each of the electrical components in the subset of components is performed by carrying out a measurement directly on the electrical components and/or via the electrical control unit.

In accordance with the invention the fault detection device may be connected to electrical components via an electrical control unit and directly to the subset of components where an error appeared.

According to one embodiment of the invention, the method may further comprise transmitting fault information indicative of the first error value and/or the operational status to a remote unit, and to receive instructions depending on the fault information from the remote unit. A remote unit may be an external computer such as e.g. artificial intelligence or a remote unit may be a person who may be an expert in the current field of technology. Thus, maintenance personnel such as e.g. a mechanic may receive instructions from an "online" expert.

According to one embodiment of the invention, the method may further comprise a step of storing fault information indicative of the first error value and/or the operational status in a database, and/or receiving, by the fault detection device, fault information from the database. Hereby, changes to the electrical system are traceable. Storing information regarding faults in the electrical system enables future processing of the fault information. It may for example be desirable to evaluate the cause of a fault or alternative solutions to resolving a fault.

According to one embodiment of the invention, the method may further comprise a step of determining an identity of the electrical control unit, wherein the identity is provided from an identification unit arranged in a cable configured to connect the fault detection device to the electrical control unit.

In one example, the fault detection is performed by means of automatic fault detection. In other words, the fault detection device automatically performs fault detection by performing the necessary steps. For example, receiving an error value, performing a second measurement to determine a faulty component, store and/or receive fault information from a server and/or remote expert unit. The function of the automatic fault detection may be comprised in the processing unit of the fault detection device, and/or at a remote unit.

Effects and features of this third aspect of the present invention are largely analogous to those described above in connection with the first aspect and/or second aspect of the invention and embodiments mentioned are largely compatible with embodiments mentioned in connection with the first and/or second aspect of the invention.

Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF DRAWINGS

These and other aspects of the present invention will now be described in more detail, with reference to the appended drawings showing embodiments of the invention, wherein.

DETAILED DESCRIPTION OF EMBODIMENTS OF THE INVENTION

In the following description, the present invention is mainly described with reference to an electrical system of a vehicle. However, the invention may be applied to any electrical system, such as electrical systems in medical devices, motorized devices, airplanes, ventilation systems, nuclear power plants, other energy harvesting systems, boats, trains, etc.

Figure 1:
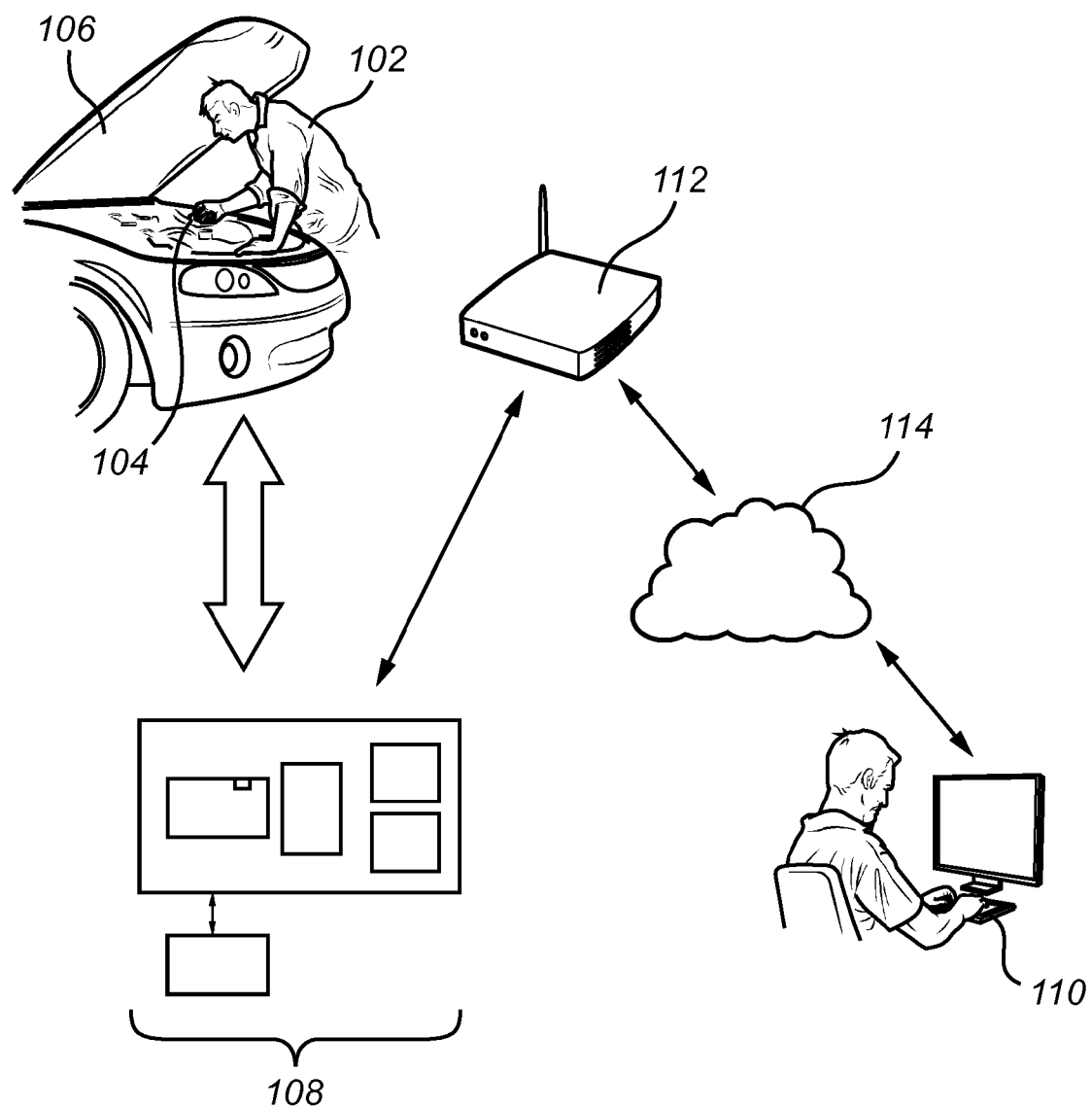
FIG. 1 schematically shows an exemplary application of a device and a method according to embodiments of the invention.

FIG. 1 illustrates an exemplary application of embodiments of at least one aspect of the invention. FIG. 1 shows a mechanic 102 investigating an electrical system 104 of a vehicle 106. The mechanic is using a fault detection device 108 for detecting an electrical fault in the electrical system 104. The fault detection device 108 is a so-called stand-alone unit 108 which may communicate wirelessly with a remote unit 110 via a router/modem 112. The stand-alone unit 108 may be connected wirelessly or via e.g. Ethernet with the router/modem 112. Thus, the stand-alone unit 108 may comprises circuitry for wireless communication. Furthermore, the stand-alone unit may comprise USB or other means for communication. The router/modem 112 may be connected to the Internet 114. Through Internet, information regarding a fault may be transferred from the stand-alone 108 unit to a remote unit 110. The remote unit 110 may be an expert 110 who may guide the mechanic to solve a problem related to the fault. The expert 110 may further remotely control the fault detection device 108 and/or the electrical system 104 via the Internet 114 or via any other communication means.

Figure 2:
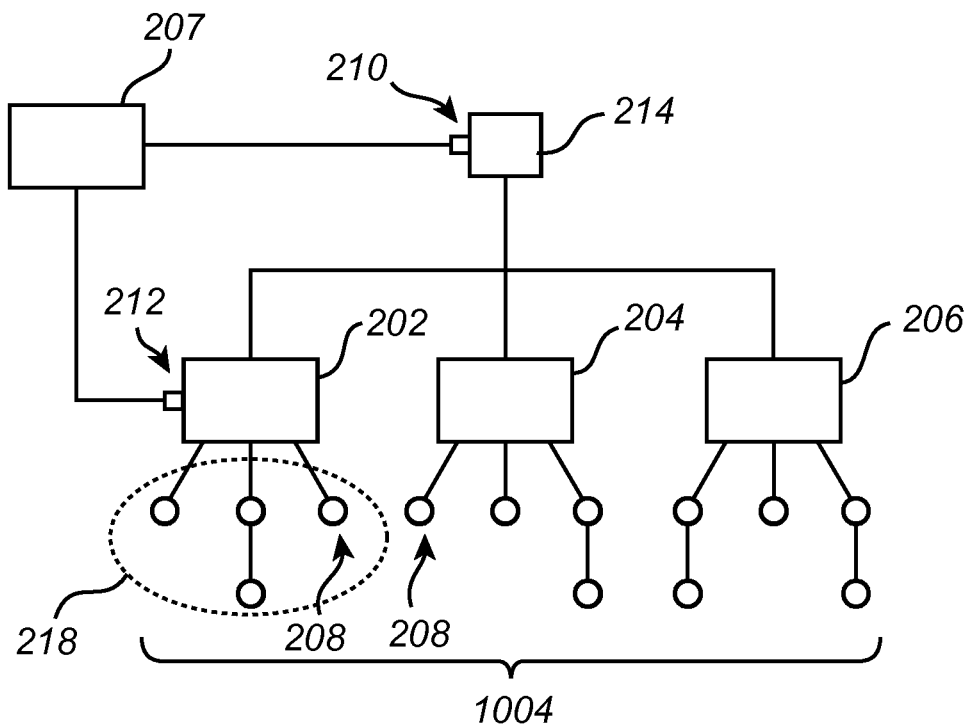
FIG. 2 schematically shows an exemplary electrical system and an exemplary fault detection device according to an embodiment connected to the electrical system.

FIG. 2 schematically illustrates a fault detection device 207 connected to an electrical system 1004. The electrical system 1004 comprises a plurality of electrical control units 202-206, each electrically connected to a plurality of electrical components 208 (only a few are numbered in order to avoid cluttering in the drawing). At least two of the electrical components 208 are connected in parallel. The electrical system 1004 further comprises a first port 210 arranged such that the fault detection device 207 may be connected in series with one of the control units 202-206 and at least one electrical component 208. Each of the control units 202-206 comprises a second port 212 such that the fault detection device 207 may be directly electrically connected to the electrical components 208 connected to the specific control unit 202-206. The electrical system 1004 may further comprise a measuring unit 214 capable of determining a first error value indicating a fault in a subset 218 of electrical components of the electrical system 1004. The first error value may be received by the fault detection device 207. A fault detected by the measuring unit 214 in the electrical system 1004 may be located along the path from the measuring unit 214 to one of the electrical components 208. For example, the fault may be located somewhere along the path from the measuring unit 214 to the electrical component 208 via the control unit 202. However, by only detecting the fault from the measuring unit 214, it is difficult to determine where the fault has occurred (e.g. in the control unit 202 or in the electrical component 208). For example, if an indication is received from the control unit 202 by the measuring unit 214 that a fault has occurred, it may not be clear if the error occurred in the control unit 202 or in the electrical component 208. By measuring over the second port 212, in other words, by measuring directly over the electrical components in the subset 218 of components connected to the electrical control unit 202 a status of the electrical components 208 in the subset 218 may be determined.

Furthermore, the fault detection device 207 may comprise a separate unit for the measurement over the first port 210, and another unit for measurement over the second port 212. For example, if a vehicle comprising an on-board diagnosing tool (OBD-tool), the fault detection device may comprise a measurement unit for reading the OBD for obtaining an error value.

Figure 3:
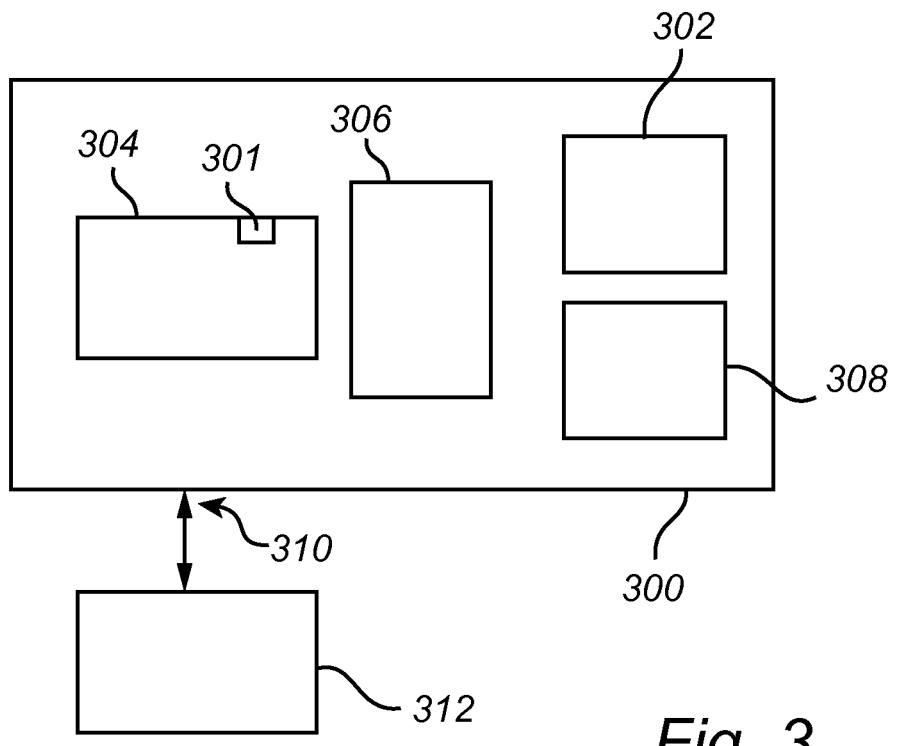
FIG. 3 schematically shows an exemplary embodiment of the device according to the present invention.

FIG. 3 schematically illustrates an exemplary embodiment of a fault detection device 300 according to the invention. FIG. 3 shows a fault detection device 300 comprising a first measuring unit 301, a second measuring unit 302, a processing unit 304, an analog-to-digital-converter (ADC) 306, and optionally an OPTOboard 308. FIG. 3 will now be elucidated with further reference to FIG. 2. The first measuring unit is configured to receive a first fault error value from an electrical control unit 202-206. The fault error value is indicative of a fault in a subset 218 of electrical components. The second measuring unit 302 is configured to be electrically connected directly to the subset 218 of electrical components. In other words, the second measuring unit 302 may be configured to be electrically connected directly to a subset 218 of electrical components connected to electrical control unit 202. The processing unit 304 is electrically connected to and configured to control the first 301 and the second measuring unit 302. The second measuring unit 302 is configured to determine a status of the electrical components in the subset 218 of electrical components, based on the first error value. A status of an electrical component 208 may e.g. be the voltage output from the component, or a fraction of a desired voltage output, or a value indicating whether the component functions properly, or any other suitable value. A status may for example be obtained by comparing a voltage output from a component 208 to a desired set point voltage. In case of a voltage output, a list comprising measured voltage values from the components 208 may be compared to a list of predetermined desired set point voltages. If a voltage value of a particular component deviates from the desired value, it may be determined that the electrical component is faulty.

Still with reference to FIG. 3, the second measuring unit 302 is in the form of a MUXboard (multiplexer board) 302 with a plurality of connection pins configured to be electrically connected directly to the electrical components 208 or via e.g. the electrical control unit 202-206. Hence, the electrical connection may be made from a parallel port of an electrical control unit 202-206 in the electrical system 1004. The MUXboard 302 may for example comprise, but is not limited to, 128 or 256 connection pins. Furthermore, the MUXboard 302 may comprise an FPGA (field-programmable gate array). Additionally, the MUXboard 302 may be configured to determine a status of the electrical components 208. Moreover, the processing unit 304 may further comprise a processor, a transceiver for wireless communication, a GSM/GPS module, and external ports such as USB, Ethernet, and/or high voltage input. The processing unit 304 may for example communicate via the wireless transceiver with a remote unit 110. The ADC 306 may be connected to the MUXboard 302 and to the processing unit 304 and is configured to simultaneously process e.g. 1 to 4 analog signals provided from the MUXboard 302, through e.g. parallel ports, and to provide the signals to the processing unit 304. The ADC 306 may e.g. comprise 4 ADC 8 bit ADC channels with 1 Mb SRAM each. Furthermore, the ADC 306 may comprise an FPGA interface. The processing unit 304 is configured to process at least two of the analog signals in parallel by e.g. a dual-core processor or parallel processors. Furthermore, at least two USB ports are arranged within the processing unit 304 and are used for transferring data to and/or from the processing unit 304, e.g. simultaneously.

With further reference to FIG. 3, the optional OPTOboard 308 may be used for resistance measurements and/or loaded measurements. A loaded measurement may be a measurement with extra load. For example, a loaded measurement may be a measurement where a high current is looped through selected pins (i.e. electrical connections to electrical components 208) of the fault detection device 300. Such measurement may help tracing fault in poor/bad connections which is not possible with a DMM (Digital Multi Meter). The OPTOboard 308 may be connected with the MUXboard 302 via ports providing galvanic isolation between the OPTOboard 308 and the MUXboard 302, for example via optical connections. The processing unit 304 may further be connected via a communication unit 310 to a user interface 312. In some examples, the user interface 312 may be built in the fault detection device 300; however, as illustrated in FIG. 3, the user interface 312 may also be an external user interface. The user interface 312 may for example be visual, audio, haptic, or combinations thereof. The visual interface may be a display on a laptop, a desktop computer, a mobile phone, an oscilloscope, or for example a separate display, or any other suitable display. An audible user interface provides e.g. vocal instructions, or sound signals. A haptic user interface may provide e.g. vibrations indicating an action, an instruction or any other event necessary for e.g. operating the fault detection device 300. The fault detection device 300 in FIG. 3 may be a stand-alone unit 300.

It should be noted that the electrical system 104, 1004 may comprise one or several electrical control units 202-206. According to at least one example embodiment, the electrical system comprises at least one electrical control unit electrically connected to a plurality of electrical components.

Figure 4:
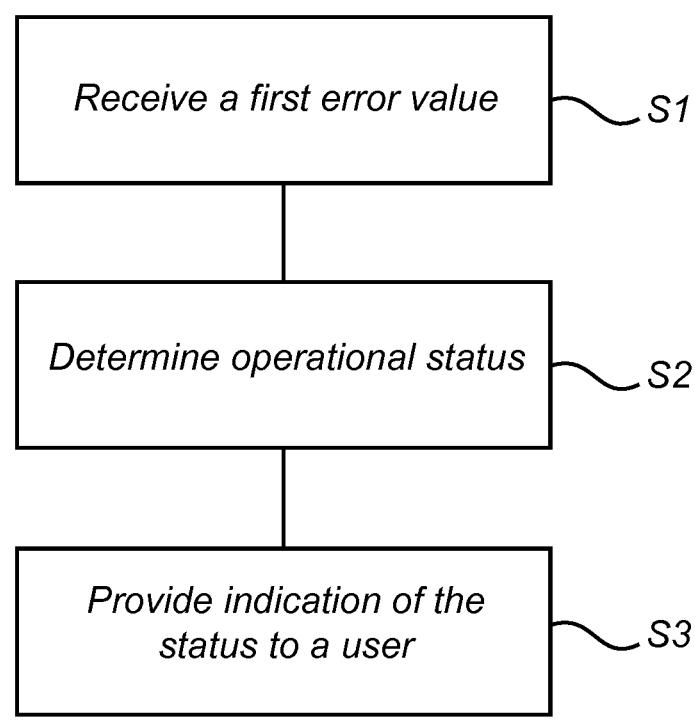
FIG. 4 is a flow-chart illustrating a method according to an exemplary embodiment of the invention.

FIG. 4 shows a flow-chart illustrating an exemplary embodiment of a method according to the invention which will be described with further reference to FIG. 2. In a first step S1, a first error value indicative of a fault in a subset 218 of the plurality of electrical components 208 is received from an electrical control unit 202-206. The first error value may be determined by a measurement across the first ports 210 of the electrical system 1004. In step S2, an operational status of each of the components 208 in the subset 218 is determined by measuring directly on each electrical component 208 in the subset 218 of electrical components 208. The status may be determined by a measurement across the second ports 212 of the electrical system 104. In a final step S3, an indication of the operational status is provided to a user. The instructions may be provided via user interface 312 such as a visual, audio, a haptic user interface or combinations thereof. Furthermore, the instructions may be provided from a remote expert, for example, via the Internet. A remote expert may be a person located at a remote location. The electrical system and/or the fault detection device may further be remotely controlled, for example by the remote expert. The remote expert may then provide assistance directly on the electrical system for locating and/or alleviating the fault in the system.

The method in FIG. 4 may further comprise storing of fault information in a database. Such information may be error codes, location of the fault, electrical system data (identification, model, etc), time of fault, duration of fault, a state of the system when the fault occurred, etc. Fault information may further be retrieved from the database for facilitating fault detection and/or for providing instructions to a user. For example, the fault may have been previously known, thus instructions may then be found in the database.

The method may further comprise identifying the electrical control unit 202-206 from identification information provided from an identification unit arranged in a cable connecting the fault detection device with the electrical system, in particular with the electrical control unit 202-206. A cable with such functionality may be a cable with wireless communication means, such as an RFID-tag that may be scanned. Scanning may provide information from the cable regarding the type of electrical control unit 202-206 or other identifying information specific to the electrical control unit 202-206, for example, the type of, and/or number of electrical components 208. With the cable, which may be referred to as a smart cable, the processing unit and/or an external reader is configured to communicate with the cable, information can be retrieved indicative of a system identity, article number, statistics, etc. The processing unit can also program and save data to the identification unit in the cable. This may protect against human error, for example connecting the wrong cable to the electrical control unit 202-206. The identification unit may further protect against clones and/or unauthorized manufactured cables.

Additionally, variations to the disclosed embodiments can be understood and effected by the skilled person in practicing the claimed invention, from a study of the drawings, the disclosure, and the appended claims. For example, the present invention is equally applicable to electrical systems of medical devices, motorized devices, airplanes, ventilation systems, nuclear power plants, other energy harvesting systems, boats, trains, etc.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A fault detection device for detecting faults in an electrical system comprising at least one electrical control unit electrically connected to a plurality of electrical components, said fault detection device comprising:
a first measuring unit configured to receive, from said electrical control unit, a first error value indicative of a fault in a subset comprising at least two of said plurality of electrical components;
a communication unit configured to provide information to a user interface;
a second measuring unit configured to be electrically connected directly and simultaneously to each of said at least two of said plurality of electrical components in said subset during a measurement; and
a processing unit connected to and configured to control said first measuring unit, said second measuring unit, and said communication unit,
wherein said second measuring unit is configured to, based on said first error value indicative of a fault in said subset, determine an operational status of each of said electrical components in said subset of electrical components, and
wherein, said communication unit is configured to provide, to said user interface, an indication of said operational status.

2. The fault detection device according to claim 1, wherein said second measuring unit is configured to determine an operational status simultaneously of each of said at least two electrical components.

3. The fault detection device according to claim 1, wherein said operational status is determined for each of said electrical components in said subset of electrical components, wherein said operational status is an indication of whether each of said electrical components in said subset is faulty.

4. The fault detection device according claim 1, wherein said first error value is received via a third measuring unit arranged between said first measuring unit and said electrical control unit.

5. The fault detection device according to claim 4, wherein said third measuring unit is an on-board diagnosing unit of a vehicle.

6. The fault detection device according to claim 1, wherein said fault detection device is electrically connected to said electrical system via a cable comprising an identification unit, wherein said processing unit and/or an external reader is configured to receive, from said identification unit, information indicative of an identity of said cable and/or said electrical control unit.

7. The fault detection device according to claim 1, wherein said user interface is a visual interface, audio interface, haptic interface, or combinations thereof.

8. The fault detection device according to claim 1, further comprising a memory storage device configured to store fault information indicative of said first error value and/or said operational status of said electrical components.

9. The fault detection device according to claim 1, further comprising a transceiver configured to transmit fault information indicative of said first error value and/or said operational status to a remote unit, and to receive, from said remote unit, information relating to said fault information.

10. A system comprising:
a remote unit;
an electrical system comprising at least one electrical control unit electrically connected to a plurality of electrical components; and
a fault detection device for detecting faults in the electrical system, said fault detection device comprising:
a first measuring unit configured to receive, from said electrical control unit, a first error value indicative of a fault in a subset comprising at least two of said plurality of electrical components;
a communication unit configured to provide information to a user interface;

a second measuring unit configured to be electrically connected directly and simultaneously to each of said at least two of said plurality of electrical components in said subset during a measurement; and a processing unit connected to and configured to control said first measuring unit, said second measuring unit, and said communication unit, wherein said second measuring unit is configured to, based on said first error value indicative of a fault in said subset, determine an operational status of each of said electrical components in said subset of electrical components; and wherein, said communication unit is configured to provide, to said user interface, an indication of said operational status.

11. The system according to claim 10, wherein said remote unit is a central expert unit further configured to remotely control said electrical system.

12. The system according to claim 10, wherein said electrical system is comprised in a vehicle, an airplane, a medical device, a motorized device, or an electrical device.

13. A method for detecting faults in an electrical system using a fault detection device, said electrical system comprising at least one electrical control unit electrically connected to a plurality of electrical components, said fault detection device comprising a first measuring unit, a second measuring unit, a communication unit, and a processing unit connected to and configured to control said first measuring unit, said second measuring unit, and said communication unit, and said method comprising the steps of:

receiving, by said first measuring unit, from said electrical control unit, a first error value indicative of a fault in a subset comprising at least two of said plurality of electrical components;

determining, by said second measuring unit, based on said first error value, an operational status of each of said electrical components in said subset of electrical components, the second measuring unit being configured to be electrically connected directly and simultaneously to each of said at least two of said plurality of electrical components in said subset during a measurement; and providing, by said communication unit, to an user interface, an indication of said operational status, the communication unit being configured to provide information to the user interface.

14. The method according to claim 13, further comprising transmitting fault information indicative of said first error value and/or said operational status to a remote unit, and to receive instructions depending on said fault information from said remote unit.

15. The method according to claim 13, further comprising a step of storing fault information indicative of said first error value and/or said operational status in a database, and/or receiving, by said fault detection device, fault information from said database.

16. The method according to claim 13, further comprising a step of determining an identity of said electrical control unit, wherein said identity is provided from an identification unit arranged in a cable configured to connect said fault detection device to said electrical control unit.

* * * * *